United States Patent [19]

Iantosca

[11] Patent Number: 5,173,109
[45] Date of Patent: Dec. 22, 1992

US005173109A

[54] PROCESS FOR FORMING REFLOWABLE IMMERSION TIN LEAD DEPOSIT

[75] Inventor: Richard Iantosca, West Palm Beach, Fla.

[73] Assignee: Shipley Company Inc., Newton, Mass.

[21] Appl. No.: 771,843

[22] Filed: Oct. 3, 1991

Related U.S. Application Data

[63] Continuation of Ser. No. 532,819, Jun. 4, 1990, abandoned.

[51] Int. Cl.⁵ .................. C23C 20/04; C23C 18/54; C23C 18/31; C23C 18/16
[52] U.S. Cl. .................. 106/1.22; 106/1.12; 106/1.13; 106/1.18; 106/1.23; 106/1.26; 427/97; 427/98; 427/436; 427/437; 427/443.1; 205/125
[58] Field of Search .................. 106/1.12, 1.13, 1.18, 106/1.22, 1.23, 1.26; 427/97, 98, 436, 437, 443.1; 204/44.4

[56] References Cited

U.S. PATENT DOCUMENTS

Re. 30,434  11/1980  Davis .................. 427/437
4,027,055  5/1977  Schneble, Jr. .................. 427/437

FOREIGN PATENT DOCUMENTS 180265  5/1986  European Pat. Off. .
3322156  1/1985  Fed. Rep. of Germany .
3800918  7/1989  Fed. Rep. of Germany .
1369073  8/1963  France .................. 427/437
49-064527  6/1974  Japan .
50-015741  2/1975  Japan .
50-057927  5/1975  Japan .................. 427/437
59-211565  11/1984  Japan .
455171  4/1975  U.S.S.R. .................. 427/437

Primary Examiner—William R. Dixon, Jr.
Assistant Examiner—Scott L. Hertzog
Attorney, Agent, or Firm—Robert L. Goldberg

[57] ABSTRACT

An acid solution for displacement plating of a reflowable tin lead alloy having a melting point not exceeding 500° F. over a cupreous surface. The displacement plating solution contains stannous ions in an amount of from 0.05 to 0.50 moles per liter, plumbous ions in an amount of from 0.01 to 0.15 moles per liter, a total content of stannous ions and plumbous ions in an amount of from 0.05 to 0.60 moles per liter and a ratio of stannous ions to plumbous ions varying from about 1.0:3.0 to 50.0:1.0. The solution is characterized by an ability to plate the tin lead alloy at a plating rate of at least 100 microinches per 15 minutes. The deposit obtained is capable of reflow and is useful in the manufacture of printed circuit boards.

23 Claims, No Drawings

PROCESS FOR FORMING REFLOWABLE IMMERSION TIN LEAD DEPOSIT

This is a continuation of copending application Ser. No. 07/532,819 filed on Jun. 4, 1990, abandoned.

BACKGROUND OF THE INVENTION

Introduction

This invention relates to a metal plating solution for the deposition of reflowable, thick deposits of tin lead alloys such as solder over metal surfaces such as cupreous based substrates including copper, brass, bronze and other alloys of copper. The invention also includes methods for accomplishing deposition of such alloys by immersion plating. The invention is especially useful for the manufacture of printed circuit boards.

DESCRIPTION OF THE PRIOR ART

Tin lead alloy having a composition of between 60 and 65 percent tin and 35 to 40 percent lead (solder) is coated onto copper traces in the manufacture of printed circuit boards. The alloy may function as an etch resist and permits attachment of components to a circuit board. For this latter use, the alloy must melt and reflow at a reasonably low temperature to avoid damage to the circuit during the heating of the board and must have an adequate thickness for surface mounting of components.

Conceptually, there are four methods available for coating tin lead alloys onto copper traces in printed circuit manufacture. These methods include (1) hot air leveling, (2) electroless plating, (3) immersion plating and (4) electroplating. The coating method selected for a specific fabrication process is dependent upon the required properties of the alloy deposited on the substrate and the specific circuit fabrication method used. Each coating process has distinct advantages and disadvantages and the metal deposit obtained from each differs from the deposits obtained by other plating methods.

It is known in the art that to be suitable for printed circuit board manufacture, following reflow, a tin lead alloy deposit over copper circuit lines must be pore free, reasonably thick, should possess a uniform cross section and should be bondable to subsequently attached components. It is also known that as metal is deposited onto a substrate from solution in a plating process, the deposit obtained is often not coherent and may contain numerous pores due to the nature of the plating reaction. Pores cannot be tolerated as they permit migration of corrosive chemicals to the surface of the board during subsequent processing steps in the fabrication process. Pores are typically eliminated in a tin lead alloy deposit by heating the board with the alloy deposit to a temperature in excess of the alloy's melting point whereby the deposit melts and pores are eliminated by reassembly of the deposit, a process known in the art as "reflow" of the deposit. In addition, a tin lead alloy must be bondable. This means the alloy must melt to permit attachment of components to a circuit board. To reflow a tin lead alloy and to bond components thereto, the tin lead alloy should melt at a relatively low temperature to avoid damage to the circuit by heating to an excessively high temperature and the deposit must be adequately thick. A thin deposit will not reflow and may not contain the minimum mass of metal required to bond a component to a circuit board, particularly if the component is surface mounted on the board. To obtain a low melting tin lead alloy, the deposit desirably has a concentration of tin and lead at or close to the low melting eutectic of tin and lead (approximately 63% tin and 37% lead by weight—i.e., solder).

Electrolytic plating of tin lead alloys is disclosed by Schlabac and Ryder, *Printed and Integrated Circuitry*, McGraw Hill Book Company, Inc., New York, 1963 at page 146. Electrolytic plating of tin lead alloys is one method of choice in the industry but suffers certain disadvantages. For example, for electrolytic deposition, a circuit board must be racked as part of an electrolytic cell which is a labor intensive step. In addition, due to uneven current densities as a consequence of a circuit pattern over which the tin lead alloy is to be deposited, the throwing power of the electrolytic bath does not provide desired uniformity and deposits of uneven thickness are obtained. This problem is aggravated further if the circuit board is one having high aspect ratio through holes. Further, deposits of a 60/40 percent tin lead alloy, the alloy of choice, requires close control of the solution composition and operating conditions of the electrolytic cell. Finally, once the tin lead alloy is coated onto the circuit, and the copper not coated with the alloy is etched, the resultant copper circuit traces are discontinuous and damaged circuits are not readily reworked because electrolytic deposition cannot take place over a discontinuous conductive substrate.

Hot air leveling is also a method conventionally used in the art for providing a tin lead deposit over copper circuit lines in printed circuit manufacture. In this process, the circuit board is floated or immersed in a molten tin lead bath. The molten coating obtained is of non uniform thickness and is then made more uniform by passing the board with the tin lead coating beneath a stream of hot air to level the coating or make it uniform. Notwithstanding the use of the hot air stream, the coating obtained is thin at the heel of the hole and non uniform and with high aspect ratio holes, thin in the center of the hole, the step of hot air leveling is time consuming and labor intensive and with high aspect holes, the coating is thin at the edge of the pads.

Electroless plating baths for each of tin and lead, separately, are known in the art. For example, an electroless tin plating bath is disclosed by Warwick and Shirley, *The Autocatalytic Deposition of Tin,* Trans. Inst. Met. Fin. 58 9 (1980) pp. 9–14 and by Juergen, *Chemical Deposition of Tin and Tin Lead,* European Institute of Printed Circuits, Deposition for PCB; Conference: Economics and Cost Savings, Conference location: Munich, West Germany, Conference Date: 1983, Monthly number: EIM8506-033415, 1983. A publication showing the electroless codeposition of tin and lead is not known. It is believed that electroless solder plating baths are difficult to formulate because an autocatalytic solution must contain a mixture of tin and lead as well as a complexing agent and reducing agent for each in a single plating solution.

Immersion plating is an electroless plating process, but is given a separate classification by the art. In immersion plating, deposition is by displacement of an elemental metal from a substrate by metal ions in a plating solution while in electroless plating, in accordance with the art accepted definition, plating takes place primarily by autocatalytic reduction of metal ions from solution.

Since immersion plating is by displacement, immersion plating, like electroless plating, does not employ an external electric current but rather is an electrochemical displacement reaction which depends upon the position the substrate metal occupies in the electromotive series relative to the metal to be deposited from solution. Plating occurs when the metal from a dissolved metal salt is displaced by a more active (less noble) metal that is immersed in the solution. Since copper is more noble than either tin or lead, it would appear that copper should not be plated by an immersion process to give a tin lead deposit. However, when complexed, under acidic conditions, the electropotentials of the tin and lead complexes relative to copper reverse making the utilization of immersion plating for the manufacture of printed circuit boards possible. However, major limitations in the use of immersion plating for circuit fabrication exist. These limitations include a relatively slow plating rate, difficulty in obtaining a desired alloy and limited deposit thickness. Limited deposit thickness is due to the fact that the immersion plating reaction is self limiting because as the coating builds to full thickness, the metal deposited from solution masks the underlying base metal which functions as the reducing agent and is required for displacement thereby preventing further displacement. Additionally, as the displaced base metal is dissolved in solution, it becomes a contaminant in solution in increasingly high concentration thereby progressively slowing the rate of displacement. Typical deposit thickness for an immersion tin deposit in the prior art is 50 to 100 microinches, mainly because of the foregoing problems in building the deposit to greater thicknesses.

If the above disadvantages with immersion plating could be overcome, there would be advantages to immersion plating over other methods for depositing tin lead alloy in circuit manufacture. Compared to electroless and electroplating, there is no hydrogen generation during the plating process and no concomitant pitting or similar plating discontinuities in the deposit. Also, the immersion plating process is not subject to surface roughness as found in electroplating processes due to "drag-over" from precleaners, anode corrosion and the like. Further, since electroless baths contain both a metal to be plated and a reducing agent, the bath is potentially unstable subject to spontaneous plating whereas, in immersion plating, there is no problem with spontaneous plate-out due to inherent instability of the bath. Moreover, with immersion plating, neither an electrically continuous circuit nor attachments of electrical contacts are required nor is there a need to maintain a precise current. Finally, an immersion deposit is generally uniform in thickness.

In spite of the potential advantages of immersion plating described above, the prior art generally dismissed immersion plating processes for use in printed circuit fabrication because the prior art believed that thick, bondable (solderable) deposits could not be obtained by immersion plating. As stated in Printed and Integrated Circuitry, supra, at page 138, (immersion deposits are) "limited in thickness, porous, and often poorly adherent and, therefore, of limited interest". The self limiting feature and thickness of immersion tin and lead plating procedures were believed to make soldering impossible and consequently, plating baths for immersion deposits of tin and lead were of minimal interest to the art.

In U.S. Pat. No. 4,194,913, incorporated herein by reference, an immersion plating composition is disclosed for deposition of tin lead alloys. In accordance with the teachings of this patent, an immersion plating solution is disclosed comprising stannous chloride in an amount of from 10 to 150 grams per liter of solution, lead chloride in an amount of from 1 to 12 grams per liter, sodium hypophosphite in an amount of from 10 to 100 grams per liter, thiourea in an amount of 40 to 100 grams per liter, hydrochloric acid in an amount of from 40 to 100 milliliters per liter and gelatin in an amount of from 0.1 to 10 grams per liter. In this patent, patentee states that the plating composition of the patent provides a faster plating rate and a deposit of increased thickness compared to that possible using prior art tin lead alloy immersion plating compositions. Though it is believed that improved immersion deposits are obtained using the compositions of said patent compared to those known to the art prior to said patent, the immersion deposits of said patent are nonetheless of inadequate thickness, are not readily reflowed and consequently, are believed to be unsuitable for the commercial manufacture of printed circuit boards.

In European published application No. 0 167 949, also incorporated herein by reference, (hereafter the "European Application"), an immersion tin plating solution that may also contain lead is disclosed as consisting of a tin salt of a fluorine containing mineral acid in an amount of from 1 to 50 grams per liter, a lead salt of a fluorine containing mineral acid in an amount of from 1 to 10 grams per liter, a fluorine containing mineral acid in an amount sufficient to provide a pH varying between 0 and 1, and a sulfur containing complexing agent in an amount of from 10 to 400 grams per liter. Though the patent application concentrates primarily on immersion tin plating solutions, an example of a tin lead plating solution is given. However, thick, reflowable deposits of tin and lead are not obtained from the compositions disclosed in the patent and the compositions are believed to be unsuitable for the commercial fabrication of printed circuit boards.

SUMMARY OF THE INVENTION

The subject invention provides an immersion plating solution capable of plating a thick, porous adherent tin lead alloy deposit, is capable of reflow, typically at a temperature of below about 500° F. and has a melting point at or near the melting point of a tin lead solder eutectic alloy. The invention also provides methods for reflow of said alloys and a process for the manufacture of printed circuit boards using the alloys.

The invention disclosed herein is based upon a combination of discoveries. One such discovery is that to reflow a tin lead alloy immersion deposit, it is necessary that the deposit be thick and porous deposit—i.e., a deposit having a thickness of at least 100 microinches and preferably at least 150 microinches or greater. Another discovery of this invention is the realization that to obtain a thick deposit capable of reflow, it is necessary to utilize a plating solution favoring a porous structure rather than a dense deposit as desired in the prior art.

In accordance with the invention, it has been found that to obtain a thick, porous deposit of a tin lead alloy as required for reflow, it is necessary to use an immersion plating solution containing a relatively high metal content—i.e. preferably in excess of 0.10 moles per liter of total metal with a tin to lead ratio of at least 1 to 1. A further discovery of the invention is that both the tin salt and the lead salt, and preferably the acid used to provide a desired pH, all have a flourine containing anion. In addition, it has been discovered that the displacement reaction favors tin and it is desirable to add a lead promoter to maintain a desired concentration of lead relative to tin and to obtain a thick deposit. Furthermore, it has been found that dissolved copper is not a contaminant, but is highly desirable to promote plating rate. Finally, it has been found that to obtain as thick a deposit as possible, it is desirable to add certain exaltants to the formulation to promote plating rate.

Following deposition of a tin lead alloy from the immersion plating solution described above, the deposit formed has a crystalline porous structure with alternating layers of lead and tin. The first layer is typically a relatively thin layer rich in lead followed by a relatively thick layer of richer in tin. If deposition is permitted to continue to full thickness where plating terminates due to the unavailability of copper necessary for the displacement reaction to occur, the top layer will typically be richer in lead. Though this structure was unplanned and an artifact of the plating solution, it has been found to be highly desirable if the part with the solder coating is to be stored for any extended period of time because the initial layer of rich in lead prevents migration of copper with time and formation of a copper tin intermetallic compound undesired in circuit manufacture. Moreover, the top layer enriched in lead protects the coating from oxidation during storage.

Following immersion deposition of the alloy of this invention, the alloy obtained is crystalline and may be reflowed by heating the alloy to a temperature above its melting point for a time sufficient to form a dense coherent coating. Reflow procedures and conditions are known in the art. Prior to reflow of the tin lead deposit of the invention, the deposit is porous with a matte gray coloration and an observable sparkle in the appropriate light indicating it is crystalline and suitable for

DESCRIPTION OF THE PREFERRED EMBODIMENTS

A tin lead alloy plating solution in accordance with this invention will have the following composition:

TABLE I

| Component | Broad Range | Preferred Range |
| --- | --- | --- |
| $Sn^{++}$ | 0.05 to 0.50 moles/liter | 0.10 to 0.30 moles/liter |
| $Pb^{++}$ | 0.01 to 0.15 moles/liter | 0.02 to 0.10 moles/liter |
| $Sn^{++} + Pb^{++}$ | 0.05 to 0.60 moles/liter | 0.10 to 0.35 moles/liter |
| Ratio $Sn^{++}:Pb^{++}$ | 1.0:3.0 to 50.0:1.0 | 1.0:1.0 to 10.0:1.0 |
| Complexing agent | 0.05 to 2.50 moles/liter | 0.50 to 2.00 moles/liter |
| Lead Promoter | 0.00 to 0.60 moles/liter | 0.05 to 0.25 moles/liter |
| pH controller | to pH 0 to 1.5 | to pH 0 to 1.2 |
| Thickness promoter | 0.00 to 1.00 moles/liter | 0.001 to 0.20 moles/liter |
| Buffer | to maintain pH | to maintain pH |
| Water | to 1 liter | to 1 liter |

The tin (stannous) and lead (plumbous) ions are provided to the bath in the form of a solution soluble salt, preferably of a fluorine containing acid. Suitable sources of the salt include tin and lead fluoride, tin and lead fluoroborate or tin and lead fluorosilicate. Preferred sources for both the tin and the lead ions are their respective fluoroborate salts.

The concentration of the tin and lead ions in solution ar set forth in Table I. It should be noted that their concentrations are relatively high compared to that which is conventional in the art and these higher concentrations are desirable to obtain a deposit capable of reflow a required for purposes herein. It is believed that the high concentration of metal ions is partly responsible for a rapid rate of deposition and the formation of a deposit that is porous and of relatively low density. Preferably, the thickness of the deposit prior to reflow is at least 100 microinches, preferably, is at least 150 microinches and more preferably, the thickness of the deposit prior to reflow exceeds 200 microinches. Though not wishing to be bound by theory, it is believed that a thick deposit is lower in concentration of copper and copper interferes with the reflow capability of a tin lead alloy deposit, especially after storage following deposition and prior to reflow. Moreover, a thick deposit is desirable for surface mounting of components to the board as the mass of material is needed to hold the component to the board.

The ratio of the tin to lead ions is as stated in Table I. One object of this invention is formation of a tin lead alloy having a concentration of tin and lead close to the low melting tin lead eutectic comprising 63 percent tin and 37 percent lead. The ratio of tin to lead in the plating solutions of the invention, as recorded in Table I, and subject to the use of a lead promoter in solution as discussed below, permits deposition of alloys with tin ranging between 50 and 82 percent and lead ranging between 50 and 18 percent. The preferred solutions deposit alloys with tin ranging between about 56 and 74 percent and lead ranging between 44 and 26 percent.

The plating solutions of the invention contain a complexing agent in an amount at least sufficient to complex all of the metal in solution and consequently, the complexing agent is present in an amount at least equimolar with the tin and lead content in solution. Preferably, the complexing agent is present in an amount in excess of the stoichiometric amount required for complete complexation of all metal initially present in solution. Where the minimum content of the tin and lead ions in solution is at least 0.05 moles per liter, the minimum content of the complexing agent is also at least 0.05 moles per liter of solution. The broad and preferred ranges for the concentration of the complexing agent are set forth in Table I.

The complexing agent used in the immersion plating solution of the invention is one preferably capable of complexing both tin and lead ions. Sulfur containing complexing agents are preferred. Preferably, the sulfur containing complexing agent is an aliphatic compound containing sulfur and nitrogen, especially thiourea or a thiourea substituted with a lower alkyl group having from 1 to 4 carbon atoms such as tetramethyl thiourea.

In metal plating solutions containing a high concentration of metal as desired herein, for reasons not fully understood, it is believed that tin deposits at a more rapid rate than lead. It is believed that this is not observed with tin lead immersion plating compositions having a lower total metals content. To avoid obtaining an alloy with an undesirably high tin content or an undesirably low lead content, it is desirable to add a component to the plating solution that promotes the rate of lead deposition relative to tin by changing the displacement potential of lead relative to tin whereby the rate of deposition of lead is increased relative to the rate of deposition of tin. Suitable lead promoters include hypophosphorus acid, sodium hypophosphite, glycerin, urea, amino acetic acid, etc. Hypophosphorus acid and an alkali metal salt of hypophosphite are preferred.

The concentration of the lead promoter in solution suitable for purposes of this invention is set forth in Table I. Though general and preferred ranges are given, the relative rate of codeposition of tin and lead is subject to several variables such as solution pH, solution temperature and the total combined metals content of the solution. Therefore, some routine experimentation may be required to find a suitable concentration for a given formulation and a given desired tin lead alloy.

The immersion plating solutions of this invention are acidic solutions having a pH ranging between about 0 to 2. Any mineral acid may be used to acidify the solution, but it is preferred that the acid have a cation common to the acid salts of tin and lead and therefore, fluorine containing acids such as hydrofluoric acid, fluoroboric acid and fluorosilic acid are suitable with fluoroboric acid being most preferred. A buffering agent such as boric acid should be used to maintain solution pH.

In a preferred embodiment of the invention, a thickness promoter is added to solution. The thickness promoter is a solution soluble salt of a metal of the Group IVb, Vb or VIb of the periodic table of the elements. Such metals include molybdenum, zirconium, titanium, chromium, vanadium, etc. Titanium salts are most preferred promoters for purposes of this invention though the method by which they promote deposit thickness is not fully understood. Titanium added in the form of titanium trichloride dissolved in hydrochloric acid constitutes a preferred thickness promoter for Thickness promoter purposes of this invention. The titanium ion concentration varies between 0 and 1.0 moles per liter and preferably between 0.001 and 0.20 moles per liter.

Chloride ion is another desirable addition to the bath as it appears to promote deposit thickness The chloride ion concentration preferably varies between 0 and 0.5 moles per liter and more preferably, between 0.0001 and 0.20 moles per liter. The most preferred concentration for both the titanium ions and/or the chloride ions is that concentration sufficient to provide a deposit of a thickness of at least 100 microinches during the first 10 minutes of plating and more preferably, of a thickness exceeding 150 microinches during the first 10 minutes of plating.

An additional desirable component in the solution is a flourine containing acid, and preferably flouroboric acid in minor amount sufficient to provide the required pH as set forth in Table I.

In addition to the above solution components, it has been observed that limited amounts of dissolved copper is a desirable component of the bath. As is known in the art, when displacement or immersion plating over copper, copper metal dissolves and is replaced by the plating metal through a displacement reaction. For this reason, copper goes into solution as plating continues. In accordance with this invention, it has been discovered that the dissolved copper is a desirable component in the bath. For this reason, with a fresh plating solution, it is desirable to initially introduce copper ions into solution prior to use of a freshly made plating bath. This can be accomplished by deposition of the alloy over scrap copper to introduce copper into the solution before depositing the immersion alloy on a circuit. In this respect, it is desirable that the dissolved copper content be at least 0.01 moles per liter of solution and preferably, variability within a range of from at least 0.04 to 0.20 moles per liter. As the concentration of dissolved copper increases beyond 0.20 moles per liter, the plating bath may yield deposits that vary in alloy composition and thickness relative to a bath having an acceptable concentration of copper.

The immersion plating solutions of this invention are used in conventional manner. A substrate having a cupreous surface is prepared for deposition by etching the cupreous metal with an etchant such as an ammonium bifluoride-hydrogen peroxide etchant. The substrate is then immersed in the immersion plating solution of the invention for a time sufficient to form a tin lead deposit having a thickness of at least 100 microinches and preferably ranging between 150 and 350 microinches. Typically, the plating time required to obtain a etchant such as an ammonium bifluoride-hydrogen peroxide etchant. The substrate is then immersed in the immersion plating solution of the invention for a time sufficient to form a tin lead deposit having a thickness of at least 100 microinches and preferably ranging between 150 and 350 microinches. Typically, the plating time required to obtain a deposit of this thickness is between about 10 and 30 minutes. The temperature of the plating solution affects the rate of deposition and deposit thickness. Plating temperatures may range from about room temperature to close to the boiling point of the plating solution but preferably range from about 100° F. to about 175° F. with a plating temperature of about 150° F. being more preferred.

The deposits formed in accordance with the invention are porous and matte gray in color with an observable sparkle dispersed throughout the deposit. It has been observed that if a visible sparkle is not observable, difficulties might be encountered during efforts to reflow the alloy. The deposits are non homogeneous and have an initial thin layer with the lead comprising at least 50 percent of the alloy and typically between 55 and 75 percent by weight followed by a relatively thick layer rich in tin with the tin typically comprising in excess of 50 percent of the alloy and when plating is permitted to continue until it stops, overcoated with a relatively thick layer rich in lead and having a composition approximating that of the first alloy layer. For reasons given above, this is a desirable layered deposit if the alloy is to be stored prior to reflow. In addition, it is believed that prior to the invention disclosed herein, immersion deposits of lead and tin and capable of reflow were not in commercial use and may not have been known in the art.

Immersion deposition of tin lead alloys in accordance with this invention is an improvement over electrolytic deposition of solder in circuit manufacture because for electrodeposition of solder, the cupreous metal over which the solder is plated must have electrical continuity for plating to take place. This means that in the manufacture of a circuit board, photomask must be applied to a copper clad circuit board substrate material in an image pattern, solder plated onto the copper electrolytically, the photomask removed and the underlying copper etched. If a defect in the solder deposit is found, the circuit board cannot readily be repaired because once the circuit is formed by etching, there is no continuity over the surface of the copper and solder cannot be plated onto the copper conductors. In contrast, the immersion plating solutions of this invention do not require continuity for deposition and if a defect is found, the solder can be stripped and immersion plating repeated.

The invention will be better understood by reference to the examples that follow:

EXAMPLES 1 to 3

This example represents the relationship between thickness of a deposit and its ability to reflow. The following formulation was prepared wherein solution components are set forth in grams per liter of solution unless otherwise indicated.

|  | Example 1 | Example 2 | Example 3 |
|---|---|---|---|
| Stannous fluoroborate | 23.0 | 46.0 | 70.0 |
| Plumbous fluoroborate | 7.4 | 15.0 | 22.0 |
| Fluoroboric acid | 2.0 | 5.0 | 7.5 |
| Thiourea | 42.0 | 85.0 | 127.0 |
| Hypophosphorus acid | 14.0 | 9.2 | 14.0 |
| Boric acid | 3.0 | 6.0 | 3.0 |
| Titanium trichloride | 0.0 | 1.0 | 2.0 |
| Hydrochloric acid | 0.0 | 0.05 | 0.1 |
| Dissolved copper | 0.01 | 0.01 | 0.01 |
| Water | to 1 liter | to 1 liter | to 1 liter |
| Solution pH | 0.8 | 0.8 | 0.8 |
| Plating temperature | 71.0° C. | 71.0° C. | 71.0° C. |
| Plating time | 10 minutes | 10 minutes | 10 minutes |

In the above formulations, the tin and lead contents were as follows:

| Example Number | $Sn^{++}$ moles | $Pb^{++}$ moles | $Sn^{++}/Pb^{++}$ | $Sn^{++} + Pb^{++}$ moles |
|---|---|---|---|---|
| 1 | 0.079 | 0.019 | 4.2:1 | 0.098 |
| 2 | 0.160 | 0.039 | 4.1:1 | 0.200 |
| 3 | 0.240 | 0.058 | 4.1:1 | 0.300 |

Copper clad epoxy glass laminate was prepared for plating by abrasive scrubbing or by immersion in an acid soak cleaner followed by immersion in a mild copper etching solution and a fluoroboric acid soak with rinsing after each treatment except for the fluoroboric acid soak. A part was then immersed into one of the aforesaid plating solutions for a period of ten minutes. The deposit thickness of each part was determined and the deposits reflowed by fluxing, warming at 250° F. in oil for about 5 to 20 seconds, reflowed in hot oil at 400° F. for from 5 to 20 seconds and quenched in oil at 250° F. The parts were then rinsed, cleaned and dried with the following results.

| Example Number | Deposit Appearance | Deposit Thickness microinches | Reflow | Alloy % Tin | Lead |
|---|---|---|---|---|---|
| 1 | matte grey, slight sparkle | 100 | yes | 56 | 44 |
| 2 | matte grey sparkling | 207 | yes | 67 | 33 |
| 3 | light matte grey slight sparkle | 252 | yes | 78 | 22 |

Example 2 constitutes the most preferred embodiment of the invention. Example 1 reflowed, but the deposit was of a quality inferior to the deposit obtained from Examples 2 and 3. Example 2 is preferred because the alloy is close to the tin lead solder eutectic.

I claim:

1. A process for providing a bondable tin lead alloy having a tin content ranging between 50 and 82 weight percent and a lead content ranging between 50 and 18 weight percent on a cupreous metal substrate, said process comprising the steps of immersing the substrate in a displacement plating solution comprising stannous ions in an amount of from 0.05 to 0.50 moles per liter, plumbous ions in an amount of from 0.01 to 0.15 moles per liter, a total content of stannous ions and plumbous ions in an amount of from 0.05 to 0.60 moles per liter, a ratio of stannous ions to plumbous ions varying from about 1.0:3.0 to 50.0:1.0, and a thickness promoter in an amount up to 1.00 moles per liter of solution, permitting plating to continue until a porous deposit of at least 100 microinches is formed, and heating said deposit to a temperature not exceeding about 400° F. for a time sufficient to reflow said deposit into a coherent alloy.

2. The process of claim 1 where plating is continued until a deposit of at least 150 microinches is formed.

3. The process of claim 2 wherein the displacement plating solution has the following composition:

| | |
|---|---|
| $Sn^{++}$ | 0.05 to 0.50 moles/liter |
| $Pb^{++}$ | 0.01 to 0.15 moles/liter |
| $Sn^{++} + Pb^{++}$ | 0.05 to 0.60 moles/liter |
| ratio $Sn^{++}:Pb^{++}$ | 1.0:3.0 to 50.0:1.0 |
| complexing agent | 0.05 to 2.50 moles/liter |
| lead plating rate promoter | up to 0.60 moles/liter |
| pH controller | to pH 0 to 1.5 |
| thickness promoter | up to 1.00 moles/liter |
| water | to 1 liter |

4. The process of claim 3 where the displacement plating solution has the following composition:

| | |
|---|---|
| $Sn^{++}$ | 0.10 to 0.30 moles/liter |
| $Pb^{++}$ | 0.02 to 0.10 moles/liter |
| $Sn^{++} + Pb^{++}$ | 0.10 to 0.35 moles/liter |
| ratio $Sn^{++}:Pb^{++}$ | 1.0:1.0 to 10.0:1.0 |
| complexing agent | 0.50 to 2.00 moles/liter |
| lead plating rate promoter | 0.05 to 0.25 moles/liter |
| pH controller | to pH 0 to 1.2 |
| thickness promoter | 0.001 to 0.20 moles/liter |
| copper ions | 0.04 to 0.20 moles/liter |
| water | to 1 liter |

5. The process of claim 3 where the complexing agent is a sulfur containing complexing agent for the stannous ions and plumbous ions.

6. The process of claim 5 where the complexing agent is thiourea.

7. The process of claim 3 where the promoter is hydrophosphorous acid.

8. The process of claim 3 where the thickness promoter is a titanium salt.

9. The process of claim 3 where the thickness promoter is a titanium chloride salt.

10. The process of claim 2 where the solution contains free chloride ions.

11. The process of claim 2 where the stannous ions and plumbous ions are in the solution in the form of a salt of a fluorine containing acid.

12. The process of claim 2 where the solution contains free fluoroboric acid to provide solution pH.

13. The process of claim 2 where the solution has the following composition:

| | |
|---|---|
| stannous fluoroborate | 0.05 to 0.50 moles/liter |
| lead fluoroborate | 0.01 to 0.15 moles/liter |
| $Sn^{++} + Pb^{++}$ | 0.05 to 0.60 moles/liter |

| -continued | |
|---|---|
| ratio $Sn^{++}$:$Pb^{++}$ | 1.0:3.0 to 50.0:1.0 |
| thiourea | 0.05 to 2.50 moles/liter |
| hypophosphorus acid | to 0.60 moles/liter |
| fluoroboric acid | to pH 1.5 |
| titanium trichloride | 0.00 to 1.00 moles/liter |
| boric acid | to maintain pH |
| copper ions | at least 0.01 moles/liter |
| water | to 1 liter |

14. The process of claim 2 where the solution where the solution has the following composition:

| | |
|---|---|
| stannous fluoroborate | 0.10 to 0.30 moles/liter |
| lead fluoroborate | 0.02 to 0.10 moles/liter |
| $Sn^{++}$ + $Pb^{++}$ | 0.10 to 0.35 moles/liter |
| ratio $Sn^{++}$:$Pb^{++}$ | 1.0:1.0 to 10.0:1.0 |
| thiourea | 0.50 to 2.00 moles/liter |
| hypophosphorus acid | 0.05 to 0.25 moles/liter |
| fluoroboric acid | to pH 1.2 |
| titanium trichloride | 0.001 to 0.20 moles/liter |
| boric acid | to maintain pH |
| copper ions | 0.04 to 0.20 moles/liter |
| water | to 1 liter |

15. A tin lead immersion deposit formed by displacement plating over a cupreous substrate, said deposit having a thickness of at least 100 microinches, a porous structure, a tin content ranging between 50 and 82 weight percent and a lead content ranging between 50 and 18 percent by weight, and alloy being characterized by an ability to reflow at a temperature below about 400° F.

16. A reflowed tin lead immersion alloy formed by displacement plating over a cupreous substrate having a thickness of at least 100 microinches, said deposit having a tin content ranging between 50 and 82 weight percent and a lead content ranging between 50 and 18 percent by weight; said alloy being characterized by a melting point below about 400° F.

17. The deposit of claim 16 where the concentration of tin ranges between 56 and 74 percent by weight and the concentration of lead ranges between 44 and 26 percent by weight.

18. The alloy of claim 16 having a tin content ranging between 56 and 74 percent by weight and a lead content ranging between 44 and 26 percent by weight.

19. The deposit of claim 16 over a printed circuit board substrate.

20. The deposit of claim 16 over a circuit board substrate having surface mount pads.

21. The deposit of claim 18 having electrical components connected thereto.

22. The deposit of claim 16 over an electroless copper deposit.

23. The deposit of claim 15 where the deposit thickness is at least 150 microinches.

* * * * *